United States Patent
Fucsko et al.

(10) Patent No.: US 7,699,998 B2
(45) Date of Patent: Apr. 20, 2010

(54) METHOD OF SUBSTANTIALLY UNIFORMLY ETCHING NON-HOMOGENEOUS SUBSTRATES

(75) Inventors: Janos Fucsko, Boise, ID (US); Grady Waldo, Boise, ID (US); Bob Carstensen, Boise, ID (US); Satish Bedge, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 709 days.

(21) Appl. No.: 11/209,059

(22) Filed: Aug. 22, 2005

(65) Prior Publication Data

US 2007/0042608 A1    Feb. 22, 2007

(51) Int. Cl.
   *H01L 21/302*    (2006.01)
(52) U.S. Cl. ............... 216/83; 216/97; 216/99; 216/101; 216/108; 216/109; 134/2; 134/902; 438/745; 438/906
(58) Field of Classification Search ......... 134/1.3; 216/99, 100, 104; 438/745, 754, 756, 758
   See application file for complete search history.

(56) References Cited

U.S. PATENT DOCUMENTS

| | | | | |
|---|---|---|---|---|
| 4,087,367 A | * | 5/1978 | Rioult et al. | 252/79.1 |
| 6,530,380 B1 | * | 3/2003 | Zhou et al. | 134/1.2 |
| 6,660,180 B2 | | 12/2003 | Lee et al. | |
| 2004/0126944 A1 | * | 7/2004 | Pacheco Rotondaro et al. | 438/197 |

OTHER PUBLICATIONS

Fabrication of MEMS devices by using anhydrous HF gas-phase etching with alcoholic vapor; Jang et. al.; Journal of Micromechanics and Microengineering; (May 2002); vol. 12, No. 3, pp. 297-306.*
Kezukza et al., Cleaning Technology in Semiconductor Device Manufacturing, Proceedings of the Sixth International Symposium, "The Control of Etching Rate for Various $SiO_2$ Films," Electrochemical Society Proceedings vol. 99-36, pp. 244-250, 2000.
Deckert, "Pattern Etching of CVD $Si_3N_4/SiO_2$ Composites in HF/Glycerol Mixtures," Journal of the Electrochemicfal Society 127 (11): pp. 2433-2438, Nov. 1980.
Wood et al., "Etching Silicon Nitride and Silicon Oxide Using Ethylene Glycol/Hydrofluoric Acid Mixtures," Electrochemical Society Proceedings vol. 99-36, pp. 258-263, 2000.

* cited by examiner

*Primary Examiner*—Anita K Alanko
(74) *Attorney, Agent, or Firm*—Dinsmore & Shohl LLP

(57) ABSTRACT

A method of substantially uniformly etching oxides from non-homogeneous substrates is provided. The method utilizes a substantially non-aqueous etchant including an organic solvent and a fluorine-containing compound. The fluorine containing compound may include HF, $HF:NH_4F$, $(NH_4)HF_2$, or TMAF:HF and mixtures thereof. The etchant may be applied to chemically non-homogeneous layers such as shallow trench isolation fill oxide layers, or to layers having a non-homogeneous composition or density at different depths within the layers, such as spin-on-glass or spin-on-dielectric films.

11 Claims, No Drawings

METHOD OF SUBSTANTIALLY UNIFORMLY ETCHING NON-HOMOGENEOUS SUBSTRATES

BACKGROUND OF THE INVENTION

The present invention relates to the manufacture of semiconductor devices. More particularly, the present invention is directed to methods of substantially uniformly etching oxides that are present on non-homogeneous substrates.

During the manufacture of components for use in semiconductor devices such as capacitors, uniformity of etching can be a problem when performing cleaning operations using an etchant solution. This is especially true where more than one type of material on a substrate is being etched simultaneously, or if the material as deposited or later densified is non-uniform in thickness, density, or composition. For example, when oxide layers are formed by chemical vapor deposition for shallow trench isolation (STI) fill applications, a chemically non-homogeneous film results which may comprise alternating silicon oxide and aluminum oxide layers. When using a conventional oxide etchant solution such as aqueous HF or aqueous $NH_4F$:HF, the exposed aluminum oxide layers tend to etch more slowly than the silicon dioxide layers, resulting in non-uniformities across the substrate surface.

There is also a problem which exists when spin-on-glass (SOG) or spin-on-dielectric (SOD) films are densified. Because the densification process is imperfect, non-uniformities in thickness and/or density often occur in such films as densification tends to be better in open areas than close to walls or other vertical components. Consequently, when conventional oxide etchants are used to clean the film surface, differential etch rates occur which leads to non-uniform etching and results in non-uniformities across the substrate surface.

Accordingly, there is a need in the art for a method of etching a substrate which provides uniform etching when the substrate surface varies in chemical composition, thickness, and/or density.

SUMMARY OF THE INVENTION

The present invention meets that need by providing a method of etching which utilizes a substantially non-aqueous etchant solution to substantially uniformly etch the surfaces of substrates, or oxide layers or films on such substrates, having variations in chemical composition, thickness, or density.

According to one aspect of the present invention, a method of etching a non-homogeneous substrate is provided comprising applying a substantially non-aqueous etchant comprising an organic solvent and a fluorine-containing component to the substrate. By "substantially non-aqueous," it is meant that the etchant contains less than about 10% water. By "non-homogeneous substrate," it is meant a substrate comprised of chemically different materials or comprised of a material having a different density and/or thickness across its surface. By "substrate", it is meant any semiconductor-based substrate including silicon, silicon-on insulator (SOI), silicon-on sapphire (SOS), doped and undoped semiconductors, epitaxial layers of silicon supported by a base semiconductor foundation, and other semi-conductor structures. The substrate need not be silicon-based.

Preferably, the organic solvent in the etchant comprises an alcohol such as isopropyl alcohol. Other suitable organic solvents include ethanol, ethylene glycol, propylene glycol, and glycerol. The fluorine containing component is preferably selected from the group consisting of HF, HF:$NH_4F$, $(NH_4)HF_2$, TMAF (tetramethyl ammonium fluoride), TMAF:HF, and mixtures thereof.

In one embodiment of the invention, the non-homogeneous substrate comprises a chemically non-homogeneous layer. For example, the layer may comprise a shallow trench isolation fill oxide layer, which comprises alternating layers of different oxides such as, for example, aluminum oxide and silicon oxide. Alternatively, the layer may have a non-homogeneous composition at different depths within the layer. A preferred method of etching a shallow trench isolation fill oxide film comprises applying a substantially non-aqueous etchant comprising HF:$NH_4F$, $(NH_4)HF_2$, or TMAF:HF and an organic solvent to the layer. Preferably, the organic solvent comprises isopropyl alcohol (IPA).

In another embodiment of the invention, the non-homogeneous substrate comprises a layer having an irregular thickness or a nonuniform density, such as a spin-on-glass film or spin-on-dielectric film. A preferred method of etching a spin-on-glass film or a spin-on-dielectric film comprises applying a substantially non-aqueous etchant comprising HF and an organic solvent to the film. Preferably, the organic solvent comprises isopropyl alcohol.

The use of a substantially non-aqueous etchant provides improved etch uniformity in comparison with prior methods which utilize aqueous-based etchants. The etchant exhibits non-specificity with respect to oxides having variations in chemical composition, thickness, or density.

Accordingly, it is a feature of embodiments of the present invention to provide a method of uniformly etching a non-homogeneous substrate using a substantially non-aqueous etchant. Other features and advantages of embodiments of the invention will be apparent from the following description and the appended claims.

DETAILED DESCRIPTION OF THE PREFERRED EMBODIMENTS

We have found that using a substantially non-aqueous etchant provides better etch control and better uniformity than the use of aqueous-based etch solutions. The use of a non-aqueous etchant provides an etch rate which is close to 1:1 for different oxides on a substrate surface, or for an oxide that has variations in density and/or thickness across its surface. This is achieved by controlling (suppressing) the dissociation of fluoride ion in HF, HF:$NH_4F$, $(NH_4)HF_2$, and TMAF:HF by using an organic solvent having a relatively low dielectric constant in comparison to water.

Examples of semiconductor manufacturing operations which require the removal of one oxide in the presence of another type of oxide include the removal of a thermal oxide, sacrificial oxide (SACOX), or pad oxide (PADOX) in the presence of shallow trench isolation (STI) fill silicon oxide films, spin-on dielectric (SOD) films, tetraethylorthosilicate films, high aspect ratio plasma (HARP) oxide films, or high density plasma (HDP) oxide films. In such situations, it may be desirable to preserve the latter oxide films, or at least closely control their removal. Another example which requires the removal of one oxide in the presence of another oxide is the controlled removal of a thin layer (i.e., 50-200 Å) of an oxide film that forms an essential part of a structure (e.g., an STI fill) from the surface of another layer. For example, a thin oxide film is removed from the surface of a nitride layer during a field clean operation prior to conducting a selective nitride etch.

Conventional aqueous hydrogen fluoride etchants cause problems because such etchants will selectively etch/remove one oxide at a higher rate than the other oxide. For example, where it is desired to remove a thermal, sacrificial, or pad oxide film in the presence of a field fill oxide film, problems arise because the aqueous HF etchant etches the field fill oxide at a higher rate than the oxide layer to be removed. The problem also arises with aqueous HF etchants in situations where the oxide layer of film varies between different areas on the layer due to differences in density or thickness.

While the use of non-aqueous etchants and non-aqueous buffer solutions is known for use in applications such as etching thermal oxides in the presence of BPSG (contact cleaning applications), it has not been proposed for use on substrates having non-homogeneous chemistries or non-homogeneous thickness or density. We found that the use of a substantially non-aqueous etchant unexpectedly demonstrates non-selectivity to substrates that are not uniform due to compositional differences (STI) or due to differences in thickness or density (spin-on glass or spin-on dielectric films). Such non-aqueous etchants demonstrate better etch control and better uniformity. This provides advantages in those situations where it is desired to preserve an essential oxide layer (e.g., STI fill) while removing another oxide layer which is present.

In one embodiment, the substantially non-aqueous etchant is preferably comprised of an organic solvent and a fluorine-containing compound. The organic solvent preferably comprises an alcohol such as isopropyl alcohol, but may comprise any suitable organic solvent including ethanol, ethylene glycol, propylene glycol, and glycerol. The fluoride ion containing component may comprise HF, $HF:NH_4F$, $(NH_4)HF_2$, TMAF:HF, or mixtures thereof. A suitable non-aqueous etchant for use in embodiments of the present invention includes about 99% isopropyl alcohol, less than 1% water, 0.06% $F^-$ (600 ppm) and about 0.03% (300 ppm) $NH_4^+$.

Where the substantially non-aqueous etchant is applied to a substrate having a non-homogeneous chemical composition, such as a film having alternating layers of different oxides for use in STI fill applications, the etchant is preferably applied by spraying the etchant solution onto the surface to be etched or immersing the substrate in an etchant bath for a time sufficient to etch the oxides. For example, a typical non-selective etch may be carried out by exposing the substrate to the substantially non-aqueous etchant for a period of from about 1 to 60 minutes, and preferably about 2-8 minutes.

Where the substantially non-aqueous etchant is applied to a film having a non-uniform thickness or density such as spin-on-glass films or spin-on-dielectric films, the etchant is applied by spraying the etchant solution onto the surface to be etched or immersing the substrate in an etchant bath for a time sufficient to etch the oxides. For example, a typical non-selective etch may be carried out by exposing the substrate to the substantially non-aqueous etchant for a period of from about 1 to 60 minutes, and preferably about 2-8 minutes.

In order that the invention may be more readily understood, reference is made to the following examples which are intended to illustrate the invention, but not limit the scope thereof.

EXAMPLE 1

A catalytic oxide deposition film for use in shallow trench isolation (STI) fill applications was formed comprising alternating silicon oxide and aluminum oxide layers. The film surface, with the ends of the alternating oxide layers exposed, was etched with a conventional aqueous dilute HF (25:1 HF) etchant composition. After a field clean with the aqueous HF etchant and a field wet nitride strip operation, the topography of the surface was viewed using an atomic force microscope (AFM). Also, a cross section of the film was viewed using a scanning electron microscope (SEM). An analysis of that section revealed that substantial dips or trenches, corresponding to the silicon oxide layers (averaging about 11 nm in depth), formed during the oxide etching. This indicates that using a conventional aqueous etchant results in a selective etch with respect to a type of silicon oxide which results in a non-uniform surface.

Another substantially identical catalytic oxide deposition film with alternating silicon oxide and aluminum oxide layers for use in STI fill applications was etched for 8 minutes using a substantially non-aqueous etchant within the scope of the present invention ($HF:NH_4F$ in IPA, with less than 1% water). After a field clean with the non-aqueous etchant and a field wet nitride strip operation, the topography of the surface was viewed using an atomic force microscope (AFM). Also, a section of the film was viewed using a scanning electron microscope (SEM). An analysis of that section revealed far better uniformity across the alternating layers of the field oxide surface. This indicates that using a non-aqueous etchant within the scope of the present invention results in lesser etch selectivity, closer to 1:1 selectivity, of the different oxides which results in a more uniform surface. The dips or trenches that were developed using the substantially non-aqueous etchant averaged only about 4 nm.

EXAMPLE 2

A series of wafers having polysilazane based spin-on-dielectric (SOD) layers were oxidized with deionized water and ozone ($DI/O_3$) for a period of 52 minutes to silicate-based films. The oxidation process produced silicate-based films having non-uniform densities. The resulting films were exposed either to a conventional aqueous etchant of a 100:1 buffered oxide etchant (BOE) comprising $NH_4:HF$ for 0.5 minutes or a non-aqueous IPA-based fluoride etchant within the scope of the present invention for 20 minutes. Respective film thicknesses and thickness ranges were measured both before and after the etches. The results are shown in Table 1 below.

TABLE 1

| | Etch Delta of DI-Ozone Oxidized SOD Films | | | | | | |
|---|---|---|---|---|---|---|---|
| Film Type | Pre-treatment Mean thickness [A] | Range [A] | Etch Process | Post-treatment Mean thickness [A] | Range [A] | Delta |
| $SOD/DI/O_3$ | 3451.8 | 72.8 | IPA:F | 3219.8 | 99.1 | 232 |
| $SOD/DI/O_3$ | 3444.4 | 92.0 | IPA:F | 3202.7 | 91.4 | 241.7 |
| $SOD/DI/O_3$ | 3474.2 | 70.2 | 100:1 BOE | 2940.9 | 432.4 | 533.3 |
| $SOD/DI/O_3$ | 3473.5 | 67.0 | 100:1 BOE | 2913.7 | 424.6 | 559.8 |

As can be seen, the film thickness range did not substantially increase during the IPA-based fluoride etch. On one wafer, the range change was (99.1−72.8)A=26.3A, while on the other wafer, the range did not appreciably change (91.4−92.0)A=−0.6A. On films that were etched using the 100:1 BOE etchant, however, the range increased substantially for both wafers, (432.4−70.2)A=362.2A for one wafer, and (424.6−67.0)A=357.6A for the other wafer. These results demonstrate that use of a non-aqueous etchant produces a much more uniform etch across a surface of a layer having a non-uniform density.

It will be apparent to those skilled in the art that various changes may be made without departing from the scope of the invention which is not considered limited to what is described in the specification.

What is claimed is:

1. A method of etching a non-homogeneous substrate comprising:
   applying a substantially non-aqueous etchant comprising an organic solvent and a fluorine-containing component to said substrate, and substantially uniformly etching a surface of said substrate.

2. The method of claim 1 wherein said organic solvent comprises isopropyl alcohol.

3. The method of claim 1 wherein said fluorine containing component is selected from the group consisting of HF, $HF:NH_4F$, $(NH_4)HF_2$, TMAF:HF, and mixtures thereof.

4. The method of claim 1 wherein said substrate comprises a chemically non-homogeneous layer.

5. The method of claim 4 wherein said substrate comprises a shallow trench isolation fill oxide layer.

6. The method of claim 5 wherein said substrate comprises alternating layers of silicon oxide and aluminum oxide.

7. The method of claim 1 wherein said substrate comprises a layer having a non-homogeneous composition which varies within the layer.

8. The method of claim 7 wherein said layer comprises a spin-on-glass film or spin-on-dielectric film.

9. The method of claim 1 wherein said substrate comprises a layer having a non-uniform density.

10. A method of etching a spin-on-glass film or a spin-on-dielectric film comprising:
    applying a substantially non-aqueous etchant comprising hydrogen fluoride in an organic solvent to said film, and substantially uniformly etching a surface of said film.

11. A method of etching a shallow trench isolation fill oxide layer comprising:
    applying a substantially non-aqueous etchant comprising $HF:NH_4F$, $(NH_4)HF_2$, or TMAF:HF in an organic solvent to said layer, and substantially uniformly etching a surface of said layer.

* * * * *